United States Patent
R. Dosdos et al.

(10) Patent No.: US 6,433,360 B1
(45) Date of Patent: Aug. 13, 2002

(54) STRUCTURE AND METHOD OF TESTING FAILED OR RETURNED DIE TO DETERMINE FAILURE LOCATION AND TYPE

(75) Inventors: S. Gabriel R. Dosdos; Joel J. Orona; Daniel C. Nuez, all of San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/231,733

(22) Filed: Jan. 15, 1999

(51) Int. Cl.[7] .......................... H01L 23/58; H01L 23/02
(52) U.S. Cl. .......................... 257/48; 257/678; 257/693; 257/787
(58) Field of Search .............................. 257/678, 693, 257/787, 788, 793, 794, 783, 48; 438/11, 14, 18, 108, 121

(56) References Cited

U.S. PATENT DOCUMENTS

| | | | | |
|---|---|---|---|---|
| 4,266,334 A | * | 5/1981 | Edwards et al. ............... | 29/583 |
| 5,468,995 A | * | 11/1995 | Higgins, III ................ | 257/697 |
| 5,525,834 A | * | 6/1996 | Fischer et al. .............. | 257/691 |
| 5,578,796 A | * | 11/1996 | Bhatt et al. .................. | 174/260 |
| 5,583,378 A | * | 12/1996 | Marrs et al. ................. | 257/710 |
| 5,598,036 A | * | 1/1997 | Ho .............................. | 257/738 |
| 5,793,117 A | * | 8/1998 | Shimada et al. ............. | 257/780 |
| 5,796,170 A | * | 8/1998 | Marcantonio ................ | 257/786 |
| 5,844,168 A | * | 12/1998 | Schueller et al. ........... | 174/52.4 |
| 5,884,398 A | * | 3/1999 | Eldridge et al. ............. | 257/777 |
| 5,891,758 A | * | 4/1999 | Honda et al. ................ | 438/118 |
| 5,894,108 A | * | 4/1999 | Mostafazadeh et al. .... | 174/52.4 |
| 5,936,845 A | * | 8/1999 | Soejima et al. ............. | 361/767 |
| 6,020,637 A | * | 2/2000 | Karnezos ..................... | 257/738 |
| 6,060,778 A | * | 5/2000 | Jeong et al. ................. | 257/710 |

* cited by examiner

*Primary Examiner*—Jasmine J B Clark
(74) *Attorney, Agent, or Firm*—Edel M. Young; Patrick T. Bever, Esq.

(57) ABSTRACT

A structure and method for testing a failed integrated circuit device includes a ball grid array substrate with its heat sink removed to form a cavity where a failed bare die is to be placed. An adhesive tape is attached to the lower surface of the ball grid array substrate covering the cavity, and the die is placed into the cavity against the sticky side of the adhesive tape. Wire bonds are formed from necessary pads on the die to electrical conductors on the substrate and the cavity and bond wires are covered with epoxy. When the epoxy is cured, the adhesive tape is removed, thus exposing the back side of the die for visual inspection while under test.

4 Claims, 4 Drawing Sheets

US 6,433,360 B1

STRUCTURE AND METHOD OF TESTING FAILED OR RETURNED DIE TO DETERMINE FAILURE LOCATION AND TYPE

FIELD OF THE INVENTION

The invention relates to testing of integrated circuit devices, particularly to testing of devices indicated as having failed an earlier test.

BACKGROUND

When integrated circuit devices are being tested on a test floor and certain types of failures are noted, a failure analyst may want to examine the bare die in detail to determine where the failure is occurring.

In the past, dice have been examined by using an emission microscope to look through the top of the die at the lower metal layers and the semiconductor substrate (transistors) to determine where the failure occurred. The die must be electrically connected so that the location of a light emission source in the die (the failure location) can be determined. But as technology has progressed, integrated circuit devices are now manufactured using up to five layers of metal, and it is not possible to look at the lower metal layers and semiconductor substrate through the top of the die. So more elaborate techniques have been developed to look at the back side of the die to examine the lower layers.

It is more difficult to examine the back side when the die is electrically connected since the die is typically mounted to some sort of supportive substrate or mounting plate that is visually opaque. Some companies, for example Hypervision and Hamamatsu, sell an expensive machine for polishing off the substrate that supports the back of the die so the back side of the die can be examined. However, the process takes hours and the die is fragile and easily subject to breakage during testing or polishing.

SUMMARY OF THE INVENTION

An easier, faster, more reliable, less expensive method allows the failure analyst to look at the back side of the die without polishing any material away. According to one embodiment of this inventive method, the die is placed into a specially prepared cavity in a BGA or other substrate, held in place by an adhesive tape, wire bonded to the BGA, and encased in epoxy for testing. In the case of packaged devices, the die is first removed from its original substrate (which also removes its bond wires) prior to placement into the specially prepared cavity on the BGA. In the case of a die that is still part of a wafer, the wafer must be diced to separate the die from the wafer.

After the die is electrically connected and encased in epoxy, the adhesive tape is then removed. Thus the back side of the die is exposed while the die is electrically connected, and can be examined while test vectors (or simpler signal combinations) are being applied to the die. An emission microscope from Carl Zeiss or Hypervision can be used for examining the back side, and this microscope allows the failure analyst to very accurately pinpoint the location of the failure.

The procure has the advantage that the back side of the die is directly attached to an adhesive tape that sits on a firm surface. Thus, the die is held firmly while being bonded to the BGA substrate. Also, when the adhesive tape is removed, the back side is directly accessible.

Preferably the adhesive tape is non-stretchy, and not spongy in a vertical direction (when the tape is lying horizontally). Also, preferably the tape is fairly easy to remove after the epoxy has cured. Preferably the epoxy is hard enough that any deformity during removing the adhesive tape is small enough that no bond wires are broken in the process. A commercial grade low cost mounting resin epoxy from Buehler® of Lake Bluff, Ill., USA has satisfactory properties.

According to another embodiment, the BGA substrate is not used. Instead, the bare die is placed on a glass slide with its semiconductor substrate side adjacent to the glass, and may be attached to the glass using epoxy, wax, or plastic (for example "Auger"). This attaching material should melt in the range of 70–250° C., preferably 100–150° C., and should be strong enough to hold the die at all testing temperatures. Also, the attaching material should not be compressible when cured. After the die is attached to the glass slide, the glass slide is attached to a probe card so that the upper surface of the die is exposed through a testing hole in the probe card. Then bond pads on the die are bonded directly to bond fingers of the probe card. The die can then be examined at either the front or back side while it is electrically connected to the probe card, which is in turn connected to a tester, and the location of a failure can be determined.

DETAILED DESCRIPTION OF THE DRAWINGS

Figure 1:
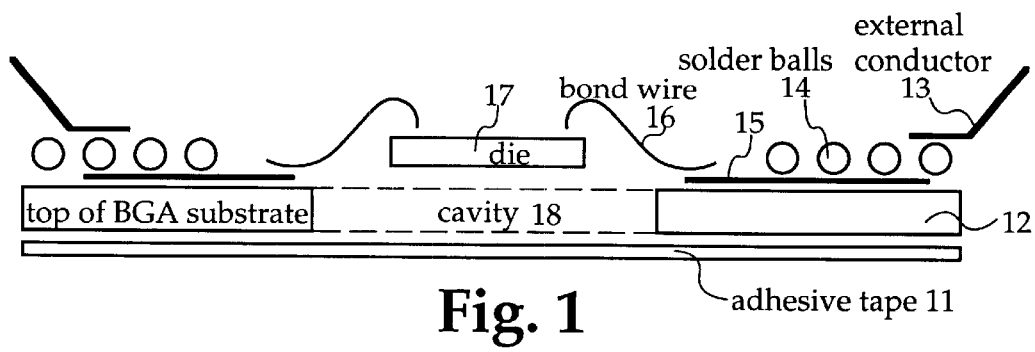
FIG. 1 shows an exploded side view of a first embodiment of the invention.
Figure 2:
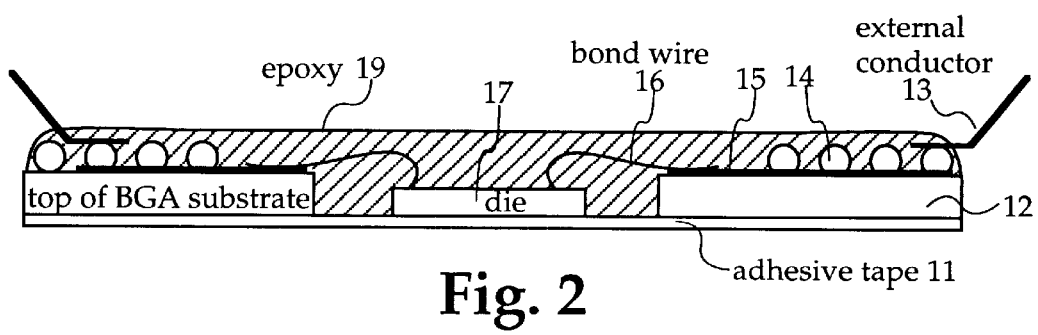
FIG. 2 shows a side view of the first embodiment with the die in place and epoxy added.
Figure 3:
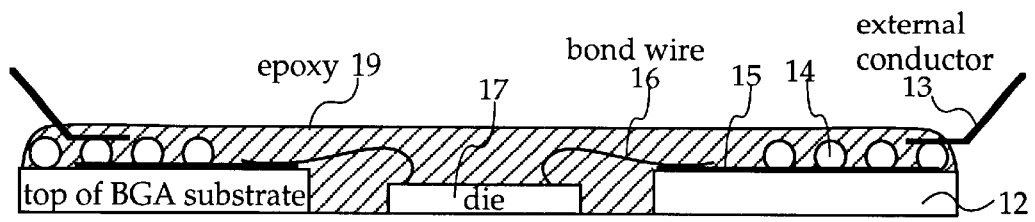
FIG. 3 shows this side view with adhesive removed.
Figure 4:
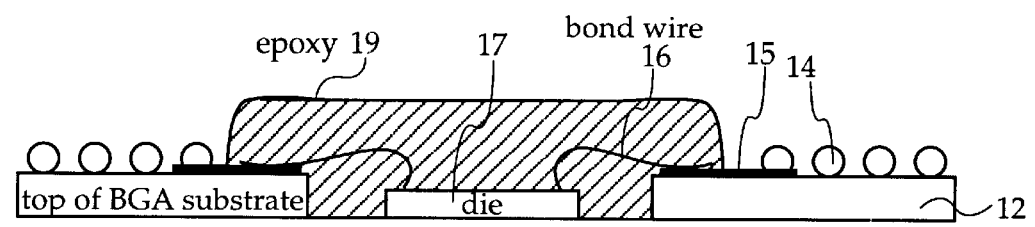
FIG. 4 shows a variation on this embodiment.
Figure 5:
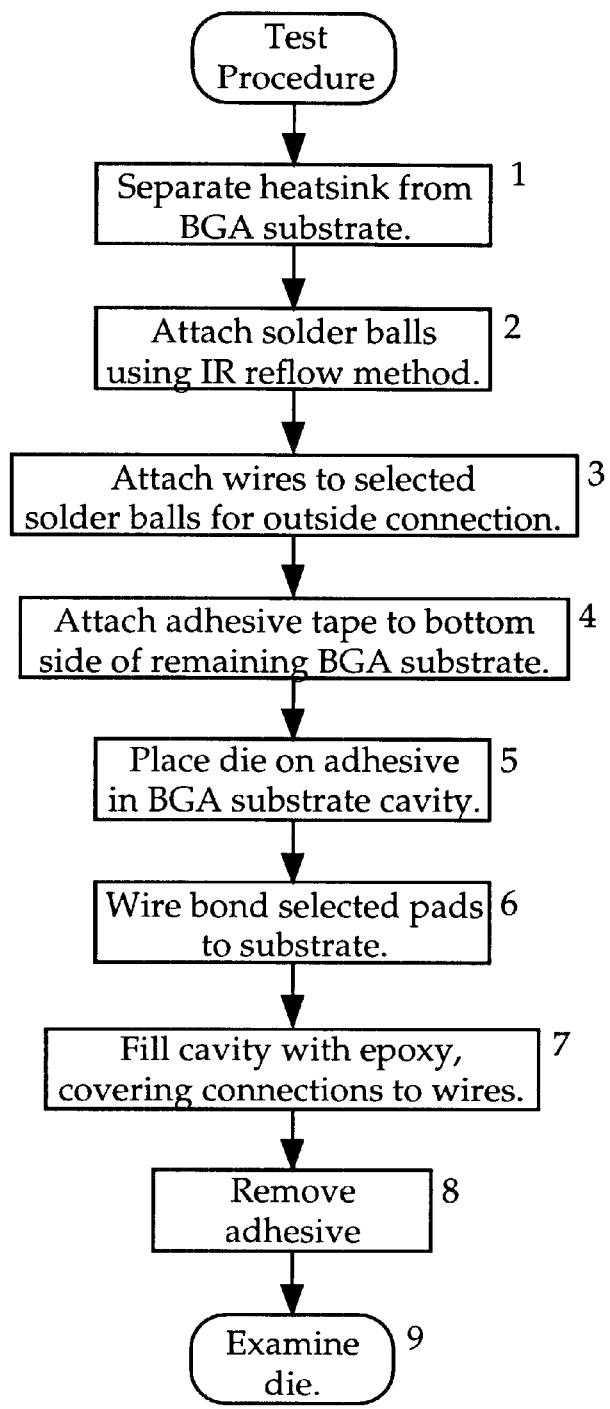
FIG. 5 shows a flow chart of steps for implementing the first embodiment.

FIG. 1 shows an exploded side view of a first embodiment of the invention. FIGS. 2, 3, and 4 show later stages in the process. A die may be indicated as defective while still in wafer form, while diced but not packaged, or after being packaged. In order to test the die, a ball grid array substrate 12 is prepared. FIG. 5 shows steps used to prepare the substrate and perform the test. As shown in step 1 of FIG. 5, a lower heat sink or other supporting structure (not shown in FIG. 1.) is removed, leaving just the upper portion 12. As shown in step 2, solder balls are attached to the upper surface of BGA substrate 12, preferably using infrared heating to reflow the solder and make connection to the underlying conductive traces 15. Next, as shown in step 3, external conductors 13 are attached to all balls that will be used during testing. This BGA substrate has a cavity 18. As shown in step 4, a piece of adhesive tape 11 is taped to the lower surface of the BGA substrate thus providing a sticky bottom to cavity 18. As shown in step 5, die 17 is placed into the cavity 18 of BGA substrate 12 with the lower surface (the semiconductor substrate) of die 17 against the sticky side of adhesive tape 11. Before placing into cavity 18, if die 17 is in wafer form, it must be singulated (separated from the wafer). If die 17 is in a package, it must be removed from the package. Positioning in cavity 18 is illustrated in FIG. 2. As shown in step 6, bond wires 16 are connected from pads on die 17 to conductive traces 15 on the upper surface of BGA substrate 12. Next, as shown in step 7, cavity 18 is filled with epoxy 19 or other glue-like material that will be rigid when set. In the embodiment of FIG. 3, the epoxy is added until it extends over solder balls 14 and ends of external conductors 13 in order to add strength to the structure. When the epoxy 19 has set, adhesive tape 11 is removed, as shown in FIG. 3, thus exposing the lower surface of die 17. In this condition, die 17 is able to be electrically connected through external conductors 13 for testing. And while die 17 is being electrically tested, die 17 can be carefully observed through its lower surface, preferably using an emission microscope, to detect hot spots or other anomalies that appear while electrical testing is in progress.

FIG. 4 shows a variation on this embodiment in which epoxy does not cover balls of the BGA package that will be contacted during testing. A cup may be used to limit the flow of epoxy. In the embodiment of FIG. 4, epoxy 19 covers bond wires 16 but not solder balls 14, and thus no external conductors 13 are needed. In such an embodiment it is not necessary to include the external conductors 13, since probes can be placed directly against the selected balls during testing.

While the above embodiment of the invention allows testing to occur without requiring polishing of the lower surface of the die, it may be desirable to polish the lower surface in order to obtain a sharper image in the emission microscope.

Figure 6A:
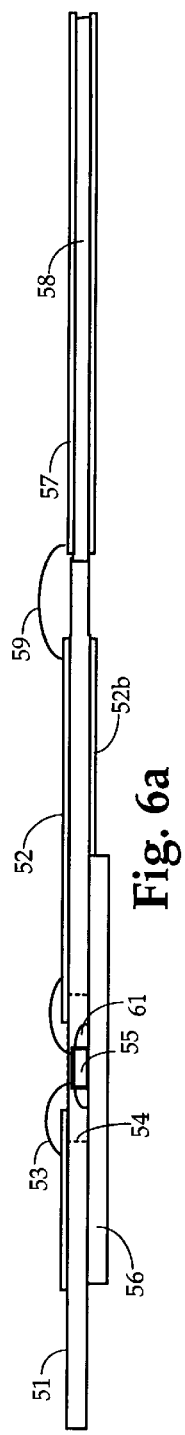
FIGS. 6a and 6b show side and top views of an IC device connected to a probe card according to another embodiment of the invention.
Figure 6B:
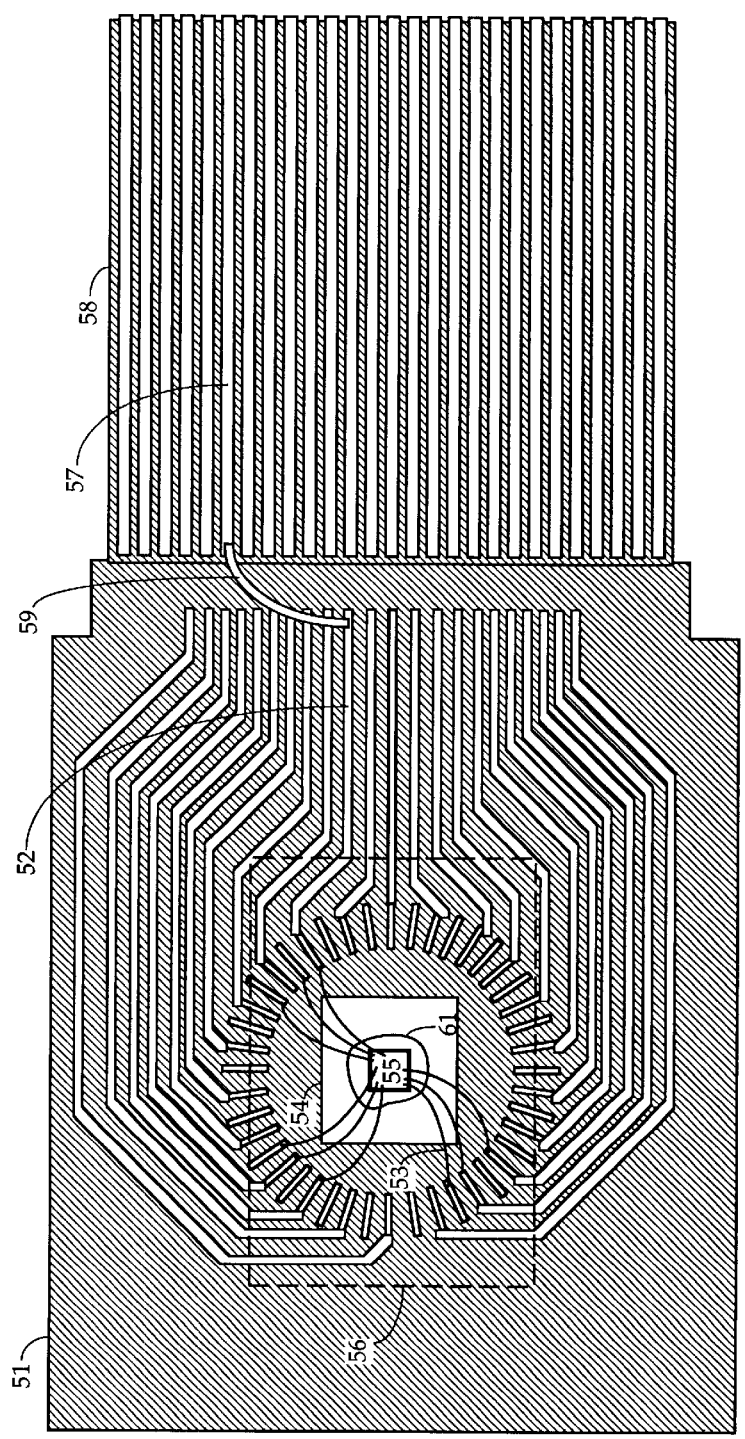

FIGS. 6a and 6b show another embodiment of the invention. This embodiment uses a modified probe card 51 for testing the failed die 55. A conventional probe card includes probes for contacting a die to be tested and a cavity for placing the die to be tested. Here, the probes have been removed from probe card 51. The die 55 to be tested is placed onto a glass slide 56 and held in place with epoxy, wax, or plastic 61 that melts in the range of 70–250° C., preferably 100–150° C. and that is strong enough to hold the die (for example "Auger" or beeswax available from hardware stores). Preferably this glue material is not compressible when cured.

After die 55 is attached to glass slide 56, glass slide 56 is attached to probe card 51 so that die 55 is exposed by cavity 54 in probe card 51. Glass slide 56 can be attached to the lower surface of probe card 51 using epoxy or plastic auger. Bond wires are then connected from pads on die 55 to traces 52 of probe card 51. Connecting wires are manually attached to connect traces 52 to trace 57 in the plug end 58 of probe card 51, only one of which is shown. Probe card 51 is of a type that allows manual wiring from any trace 52 to any trace 57 in order to provide convenient connections to a tester computer when die 55 is being electrically tested. (Probe cards typically have traces such as 52 on both surfaces. Lower traces are not shown in FIG. 6b.)

Figure 7A:
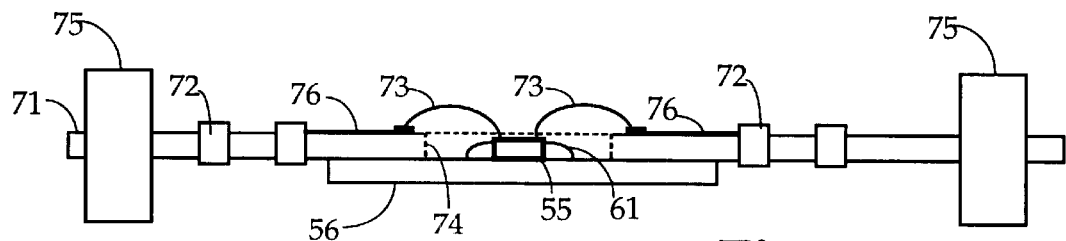
FIGS. 7a and 7b show side and top views of another embodiment of the invention.
Figure 7B:
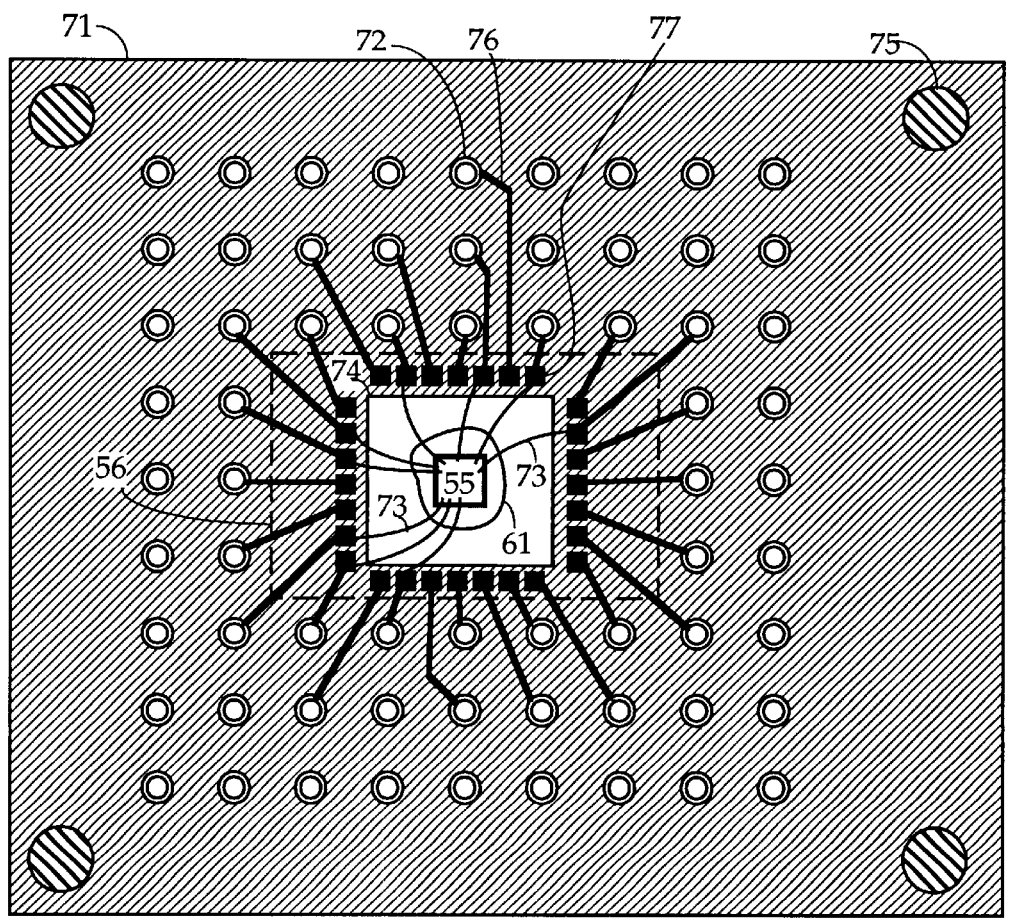

FIGS. 7a and 7b show side and top views of another embodiment of the invention. A board 71 is prepared with conductive through holes 72, contact pads 77, traces 76 connecting the contact pads 77 to the through holes 72, and a central opening 74. Standoffs 75 are attached to the board. A die 55 to be examined is attached with plastic 61 to a glass slide 56. This glass slide 56 is attached to the board 71 so that the die 55 is positioned within central opening 74. Bond wires 73 are then connected from selected pads on the die 55 to selected contact pads 77. Electrical signals can be applied to die 55 by touching probes (not shown) to either the upper or lower surfaces of the through holes 72.

Both surfaces of die 55 can be examined in this arrangement. The embodiment is particularly useful because the board with its standoffs 75 can be placed on a table with either side up and an emission microscope placed above the die 55. Typically, the two surfaces of the die are examined in turn. In either orientation, the probes can extend down from above the die and the microscope sits above the die, so the arrangement is convenient to the failure analyst.

From the above description it can be seen that other embodiments are also possible. Such embodiments are intended to fall within the scope of the present invention. For example, although FIGS. 7a and 7b show a board to which the die is attached, a die on a glass slide may also be attached to a BGA package such as shown in FIGS. 1–4. For another example, if it may be desirable to polish the back side of the die, the glass slide structure may be formed in a way that the cavity holding the die extends downward below the level of the board or substrate. The cavity can be filled with epoxy and after the epoxy has cured, the glass slide and even part of the back side of the die may be polished away for easier viewing of failures in the die.

We claim:

1. A structure for testing an integrated circuit device comprising:

a supporting structure having a cavity extending between an upper surface and a lower surface, and having electrical conductors formed on the upper surface;

a transparent slide attached to the lower surface of the supporting structure such that the transparent slide covers an end of the cavity;

a die placed within the cavity such that a lower surface of the die is mounted against the transparent slide, the die also having an upper surface facing away from the transparent slide and pads formed on the upper surface;

bonding wires connecting the pads on the die to the electrical conductors on the supporting structure; and wherein the lower surface of the die is observable for testing through the transparent slide.

2. The structure of claim 1 wherein the supporting structure is a probe card with edge connectors.

3. The structure of claim 1 wherein the transparent slide is made of glass.

4. The structure of claim 1 wherein the die is attached to the transparent slide using auger plastic.

* * * * *